US012628650B2

(12) United States Patent
Syu et al.

(10) Patent No.:  US 12,628,650 B2
(45) Date of Patent:  May 12, 2026

(54) MOUNTING STRUCTURE AND MODULE DEVICE HAVING THE SAME

(71) Applicant: Industrial Technology Research Institute, Hsinchu (TW)

(72) Inventors: Ji-Yuan Syu, Kaohsiung City (TW); Yuan-Cheng Huang, New Taipei City (TW); Yu-Chih Wang, Taipei City (TW)

(73) Assignee: Industrial Technology Research Institute, Hsinchu (TW)

( * ) Notice: Subject to any disclaimer, the term of this patent is extended or adjusted under 35 U.S.C. 154(b) by 528 days.

(21) Appl. No.: 18/152,164

(22) Filed: Jan. 10, 2023

(65) Prior Publication Data

US 2024/0105546 A1      Mar. 28, 2024

(30) Foreign Application Priority Data

Sep. 22, 2022    (TW) ................................. 111135966

(51) Int. Cl.
*H10W 40/60*          (2026.01)
*H10W 76/15*          (2026.01)
(52) U.S. Cl.
CPC .......... *H10W 40/611* (2026.01); *H10W 76/15* (2026.01); *H10W 40/60* (2026.01)
(58) Field of Classification Search
CPC .............. H01L 23/4006; H01L 23/053; H01L 2023/4087; H10W 40/60; H10W 40/611; H10W 76/15
See application file for complete search history.

(56) References Cited

U.S. PATENT DOCUMENTS

| | | | |
|---|---|---|---|
| 7,477,518 | B2 | 1/2009 | Stolze et al. |
| 9,906,157 | B2 | 2/2018 | Tan et al. |
| 11,272,625 | B2 | 3/2022 | Prajuckamol et al. |
| (Continued) | | | |

FOREIGN PATENT DOCUMENTS

| | | |
|---|---|---|
| CN | 104066291 | 9/2014 |
| CN | 112243323 | 1/2021 |
| (Continued) | | |

OTHER PUBLICATIONS

"Office Action of Taiwan Counterpart Application", issued on Mar. 20, 2023, p. 1-p. 10.

*Primary Examiner* — Allen L Parker
*Assistant Examiner* — Peter Krim
(74) *Attorney, Agent, or Firm* — JCIPRNET

(57) ABSTRACT

A module device on a first substrate includes a power module, a housing, a pair of mounting structures. The housing covers the power module. The mounting structures are installed on a pair of opposite sides of the housing, and the mounting structure includes a main body, a locking ring, a pair of ribs and anchoring portions. The locking ring extends from a side toward an inner side of the main body, and is a double-ring structure, which includes an inner and an outer ring. A first side of the outer ring is connected to the main body, a second side of the outer ring is connected to the inner ring. The ribs extend along a normal direction of the top surface of the main body. The anchoring portions are disposed at the end of the ribs, and an extending direction is perpendicular to an extending direction of the rib.

16 Claims, 12 Drawing Sheets

(56)  References Cited

U.S. PATENT DOCUMENTS

| | | | |
|---|---|---|---|
| 2005/0111196 A1* | 5/2005 | Wang .................. | H01L 23/4093 |
| | | | 248/510 |
| 2008/0158822 A1* | 7/2008 | Stolze .................. | H10W 78/00 |
| | | | 257/E23.084 |
| 2014/0285973 A1 | 9/2014 | Hong et al. | |
| 2016/0352245 A1* | 12/2016 | Tan ...................... | H02M 7/003 |
| 2017/0170084 A1* | 6/2017 | Yao ......................... | H01L 23/18 |
| 2019/0006262 A1 | 1/2019 | Lewin et al. | |
| 2021/0210409 A1* | 7/2021 | Han ...................... | H10W 40/60 |

FOREIGN PATENT DOCUMENTS

| | | |
|---|---|---|
| EP | 3098843 | 11/2016 |
| TW | I762765 | 5/2022 |
| TW | I772243 | 7/2022 |
| TW | M636532 | 1/2023 |

* cited by examiner

13

1321

1322

13

MOUNTING STRUCTURE AND MODULE DEVICE HAVING THE SAME

CROSS-REFERENCE TO RELATED APPLICATION

This application claims the priority benefit of Taiwan application serial no. 111135966, filed on Sep. 22, 2022. The entirety of the above-mentioned patent application is hereby incorporated by reference herein and made a part of this specification.

TECHNICAL FIELD

The disclosure relates to a module device, and more particularly, to a module device of a power module.

BACKGROUND

The rapid development of the process technology of power semiconductors has greatly improved the functions of electronic elements. However, with the improvement of the processing speed and current of electronic elements, the heat generated by the electronic elements also increases. If the heat cannot be effectively removed, the electronic elements may not achieve optimal performance or even fail.

The heat generated when the power semiconductor operates will cause thermal deformation of the structure of the power element, which not only affects the heat transfer effect, but also affects the working performance of the power semiconductor and shortens the life of the power semiconductor due to the increase in the working environment temperature of the power semiconductor. In order to effectively dissipate heat to the power semiconductor, some module designs directly lock the power module on the heat dissipation structure, so that the power module can be stably in contact with the heat dissipation structure. However, if the power module is not properly locked and skewed, the power module cannot be reliably in contact with the heat dissipation structure, resulting in a decrease in heat dissipation efficiency.

SUMMARY

The disclosure provides a module device, which has good heat dissipation effect and can prolong the service life of a power module.

A module device of the disclosure is adapted to be installed on a first substrate. The module device includes a power module, a housing, a pair of mounting structures, and a pair of locking members. The housing covers the power module. The mounting structures are installed on a pair of opposite sides of the housing, and each of the mounting structures includes a main body, a locking ring, a pair of ribs, and a pair of anchoring portions. The locking ring extends from a side of the main body toward an inner side of the main body, and the locking ring is a double-ring structure, which includes an inner ring and an outer ring. A first side of the outer ring is connected to the main body, a second side of the outer ring is connected to the inner ring, and the first side and the second side are opposite sides. The rib extends from a top surface of the main body along a normal direction of the top surface. The anchoring portion is disposed at the end of the rib, and an extending direction of the anchoring portion is perpendicular to an extending direction of the rib.

A module device of the disclosure is adapted to be installed on a first substrate. The module device includes a power module, a housing, and a pair of mounting structures. The housing covers the power module. The mounting structures are installed on a pair of opposite sides of the housing, and at least one of the mounting structures includes a main body, a locking ring, a pair of ribs, and a pair of anchoring portions. The locking ring extends from a side of the main body toward an inner side of the main body, and the locking ring is a double-ring structure, which includes an inner ring and an outer ring. The locking ring has a slit opening, and the slit opening penetrates the outer ring and the inner ring from the side where the locking ring is connected to the main body. The rib extends from a top surface of the main body along a normal direction of the top surface. The anchoring portion is disposed at the end of the rib, and an extending direction of the anchoring portion is perpendicular to an extending direction of the rib.

Based on the above, in the module device of the disclosure, the mounting structure is improved, and the improved mounting structure may effectively increase the contact area between the bottom surface of the power module and the first substrate, thereby improving the overall heat dissipation effect of the module device.

DESCRIPTION OF THE EMBODIMENTS

Figure 1:
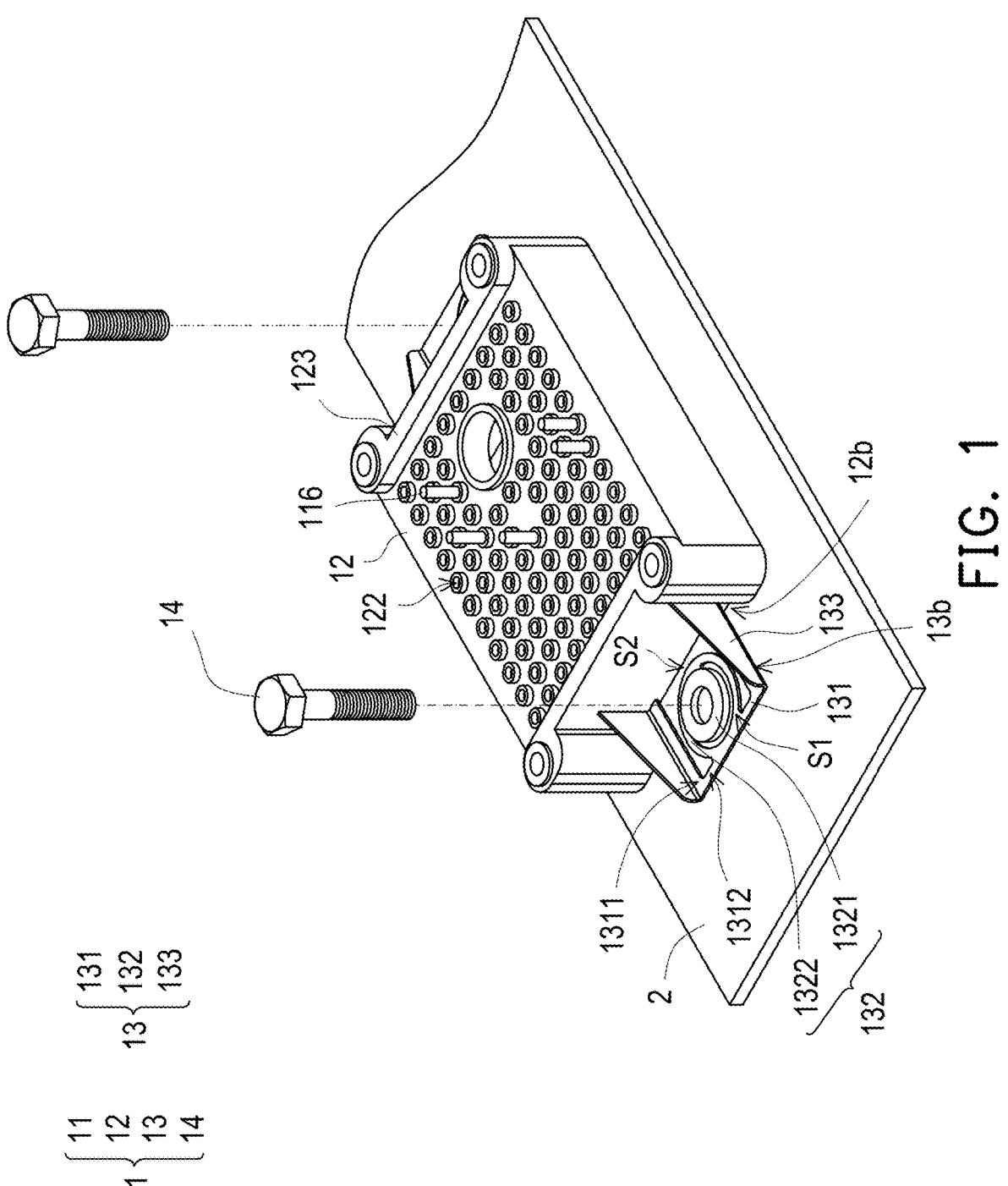
FIG. 1 is a schematic diagram of a module device according to an embodiment of the disclosure.
Figure 2:
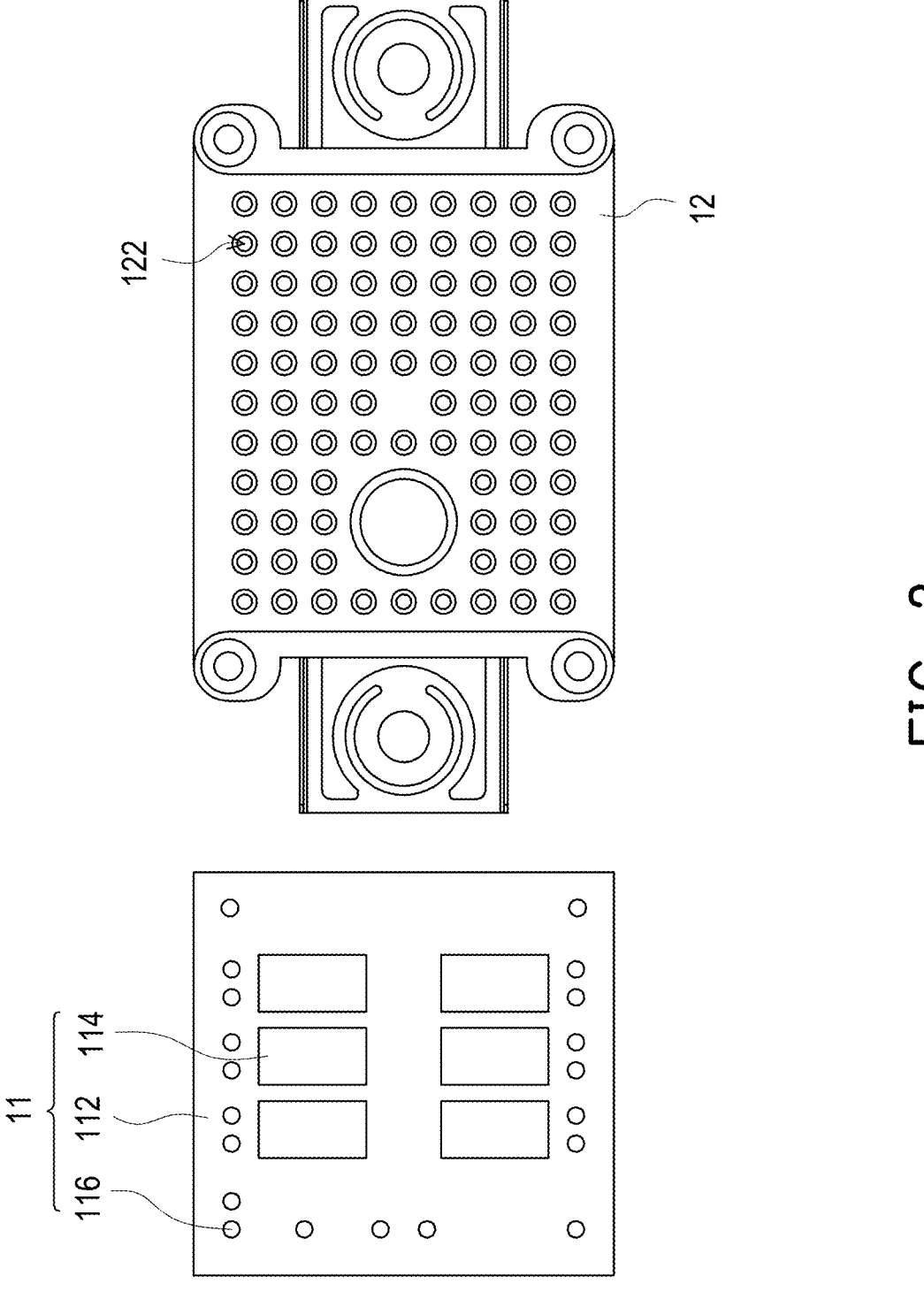
FIG. 2 is an exploded schematic diagram of the disassembly of a housing and a power module in the module device of FIG. 1.

FIG. 1 is a schematic diagram of a module device according to an embodiment of the disclosure, and FIG. 2 is an exploded schematic diagram of the disassembly of a housing and a power module in the module device of FIG. 1. Please refer to FIGS. 1 and 2 at the same time. A module device 1 of the embodiment is adapted to be installed on a first substrate 2. The first substrate 2 is a heat dissipation substrate having a heat dissipation effect or a heat dissipation structure (not shown), and the heat dissipation structure is, for example, a fin.

Continuing the above description, the module device 1 includes a power module 11, a housing 12, a pair of mounting structures 13, and a pair of locking members 14.

The housing 12 covers the power module 11. Specifically, the power module 11 has a second substrate 112, at least one power semiconductor 114, and multiple pins 116. The power semiconductor 114 and the pins 116 are disposed on the second substrate 112, and the housing 12 has multiple sockets 122 into which the pins 116 are correspondingly inserted, so that the housing 12 and the power module 11 are relatively fixed. One pin 116 is correspondingly inserted into one socket 122. However, the number of the sockets 122 is larger than the number of the pins 116, and two pins 116 do not exist in the same socket 122 at the same time. When the module device 1 is assembled on the first substrate 2, the second substrate 112 is in contact with the first substrate 2.

The housing 12 configured to cover the power module 11 is made of non-conductive material, such as glass fiber or thermoplastic polymer plastic. This is because if the housing 12 is made of a conductive material, when the housing 12 is in contact with the power semiconductor 114 or the pins 116, the housing 12 becomes the ground of the power module 11 and causes the power semiconductor 114 to fail. Therefore, selecting a non-conductive material for the housing 12 may prevent the power semiconductor 114 from failing.

Figure 3B:
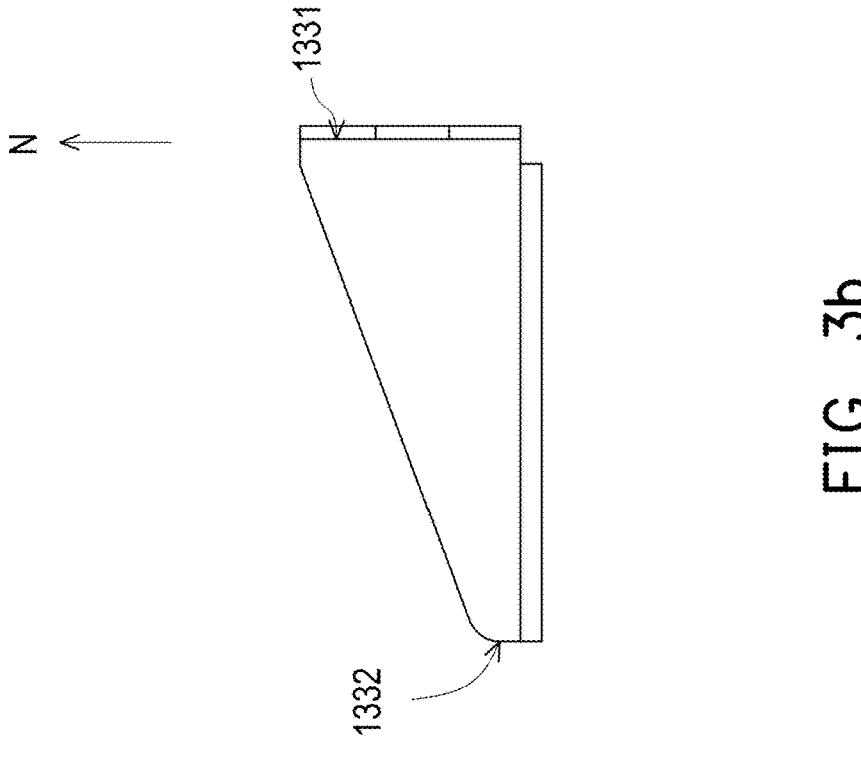
FIG. 3b is a side view of the mounting structure.
Figure 3A:
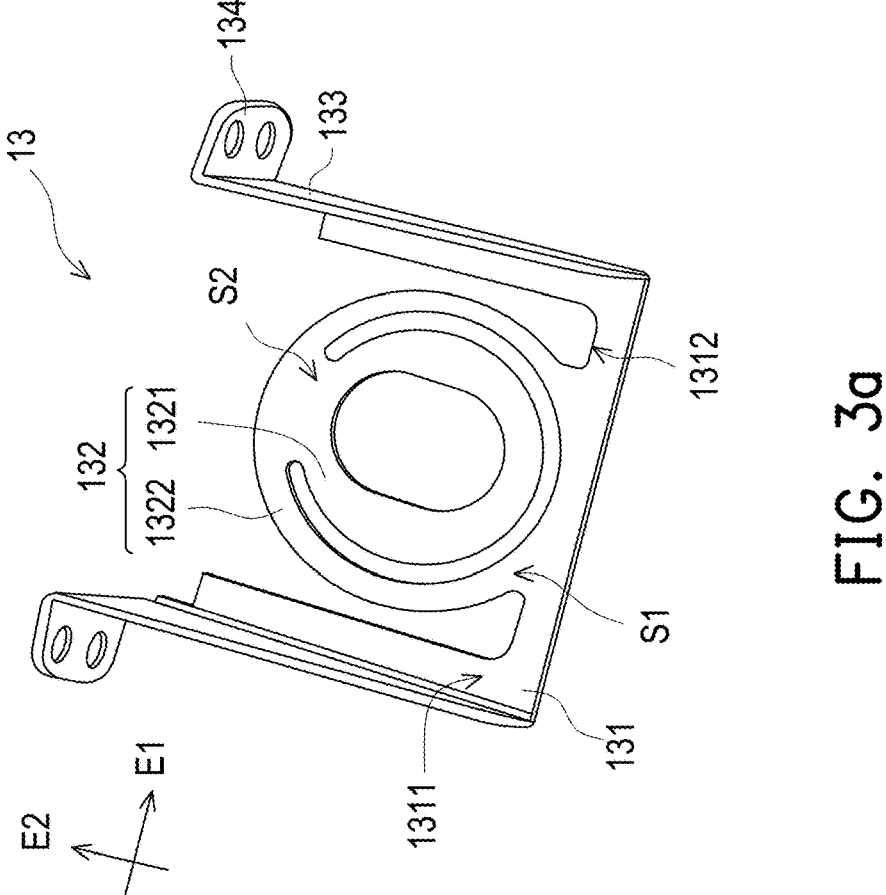
FIG. 3a is a perspective view of the mounting structure.

FIG. 3a is a perspective view of the mounting structure. Please refer to FIGS. 1, 2, and 3a at the same time. The mounting structures 13 are installed on a pair of opposite sides of the housing 12, and each of the mounting structures 13 includes a main body 131, a locking ring 132, a pair of ribs 133, and a pair of anchoring portions 134.

The locking ring 132 extends from a side 1312 of the main body 131 toward the inner side of the main body 131 to form an elastic sheet structure. Moreover, the locking ring 132 is a double-ring structure, which includes an inner ring 1321 and an outer ring 1322. A first side S1 of the outer ring 1322 is connected to the main body 131, a second side S2 of the outer ring 1322 is connected to the inner ring 1321, and the first side S1 and the second side S2 are opposite sides. In the embodiment, the outer contours of the inner ring 1321 and the outer ring 1322 are circular shapes or similar to circular shapes, but are not limited thereto. The outer contours of the inner ring 1321 and the outer ring 1322 may also be oval, rectangular or polygonal shapes.

FIG. 3b is a side view of the mounting structure. Please refer to FIGS. 1, 3a, and 3b at the same time. The above-mentioned rib 133 extends from a top surface 1311 of the main body 131 along a normal direction N of the top surface 1311. The anchoring portion 134 is disposed at the end of the rib 133, and an extending direction E1 of the anchoring portion 134 is perpendicular to an extending direction E2 of the rib 133.

In the embodiment, the rib 133 extends from the side 1312 of the main body 131 where the locking ring 132 is connected to the main body 131 in a shape similar to a triangle or closer to a trapezoid toward the corresponding anchoring portion 134. A first side 1331 of the rib 133 is adjacent to the anchoring portion 134, a second side 1332 of the rib 133 is adjacent to the side 1312 of the main body 131 where the locking ring 132 is connected to the main body 131, and the length of the first side 1331 is greater than the length of the second side 1332. In the embodiment, the shape of the rib 133 can effectively increase the contact area between the mounting structure 13 and the housing 12, thereby improving the connection stability of the mounting structure 13 and the housing 12, and enhancing the structural rigidity of the mounting structure 13 at the same time.

Please continue to refer to FIGS. 1, 2, and 3a. The anchoring portion 134 is embedded in a sidewall 123 of the housing 12. The anchoring portion 134 may be embedded in the sidewall 123 of the housing 12 by means of injection molding.

The above-mentioned locking member 14 passes through the corresponding locking ring 132 and is locked into the first substrate 2. The locking member 14 may be selected from screws or rivets.

Before the module device 1 is fixed on the first substrate 2, the power module 11, the housing 12, and the mounting structure 13 have been fabricated or assembled into one body.

Next, the module device 1 is placed on the first substrate 2, and the pins 116 of the power module 11 are inserted into the corresponding sockets 122.

At this time, the locking member 14 has not yet passed through the locking ring 132 of the mounting structure 13 and been locked into the first substrate 2.

Incidentally, before the locking member 14 is locked into the first substrate 2, a gap exists between a bottom surface 13b of the mounting structure 13 and a bottom surface 12b of the housing 12. Specifically, the bottom surface 13b of the mounting structure 13 embedded in the housing 12 is not flush with the bottom surface 12b of the housing 12, but is slightly higher than the bottom surface 12b of the housing 12. Such a configuration not only can reserve a space to buffer the force exerted by the locking member 14 on the mounting structure 13, but may also allow other areas of the first substrate 2 other than the area of the first substrate 2 corresponding to the locking ring 132 of the mounting structure 13 to have design margins for other applications. In addition, such a configuration may further prevent the mounting structure 13 from overly scratching the surface of the first substrate 2 during the assembly process, resulting in damage to the surface of the first substrate 2.

Figure 4:
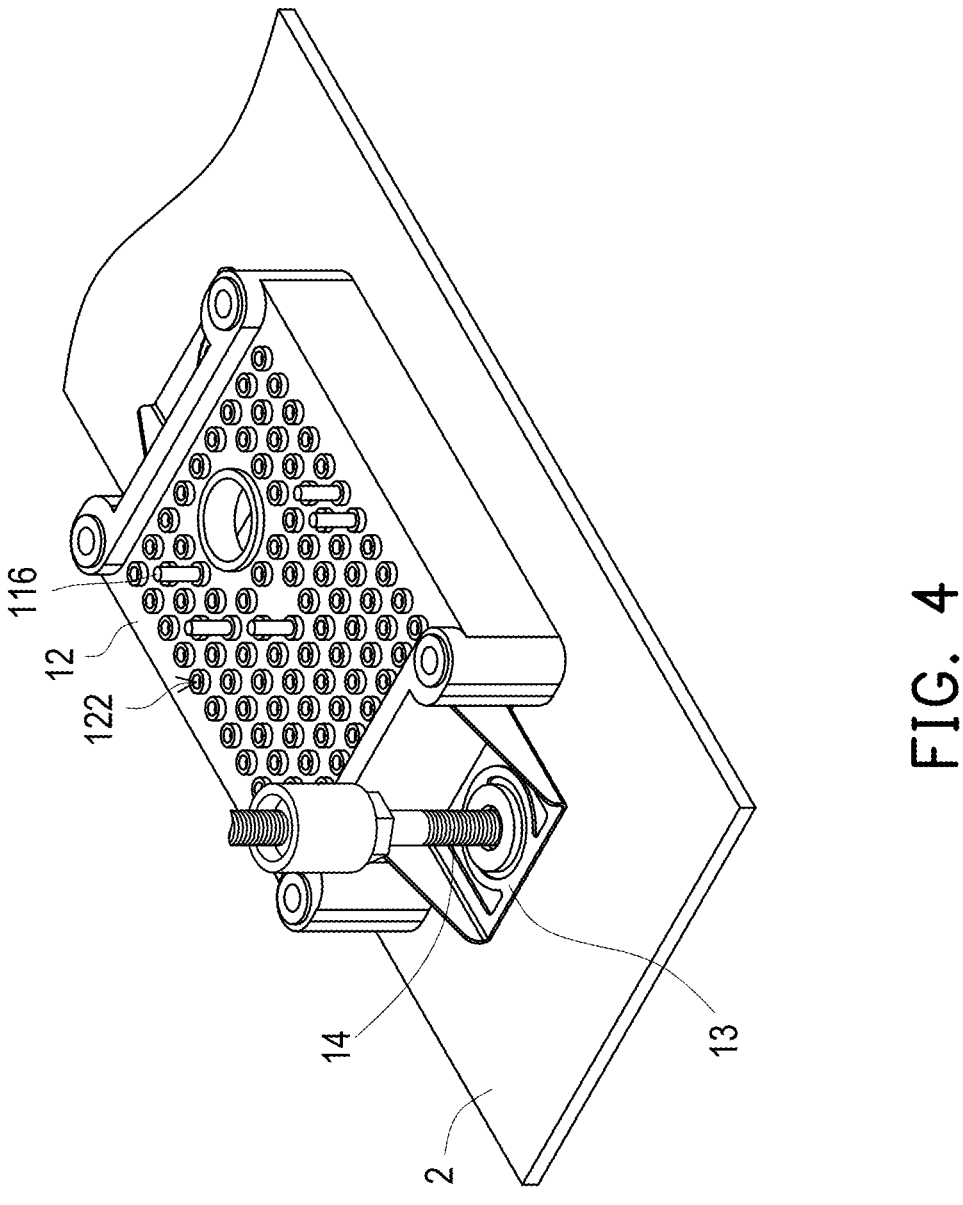
FIG. 4 is a schematic diagram of the locking member passing through the mounting structure to be locked into the first substrate.

FIG. 4 is a schematic diagram of the locking member passing through the mounting structure to be locked into the first substrate. After the locking member 14 passes through the mounting structure 13 and is locked into the first substrate 2, the bottom surface (not shown) of the locking ring 312 of the mounting structure 13 is in contact with the first substrate 2. Specifically, the locking member 14 passes through the inner ring 1321 of the locking ring 132 to be locked into the first substrate 2. The locking member 14 abuts against and applies pressure to the inner ring 1321 and the outer ring 1322 at the same time, and the pressure on the inner ring 1321 and the outer ring 1322 is transmitted to the housing 12 through the entire mounting structure 13, so that the housing 12 applies uniform stress to the power module 11 in a locking direction parallel to the locking member 14.

Figure 5A:
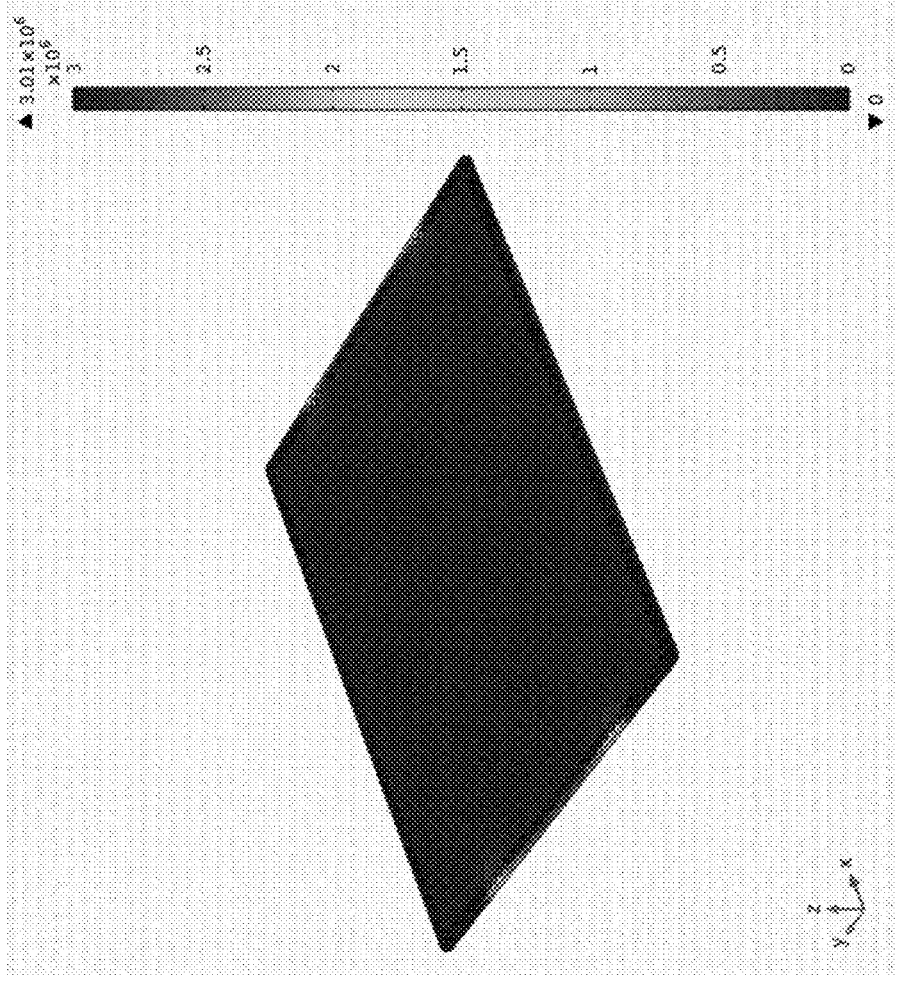
FIG. 5a is a schematic diagram illustrating that the second substrate of the power module is subjected to uniform stress.
Figure 5B:
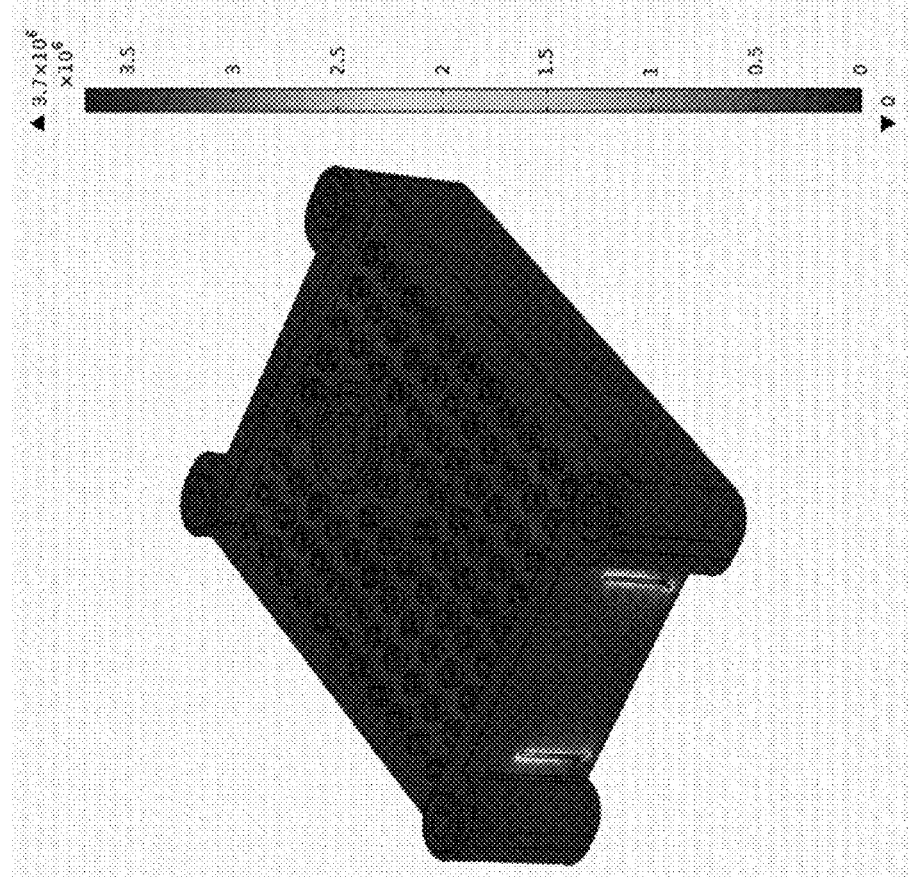
FIG. 5b is a schematic diagram of the stress experienced by the housing.
Figure 5C:
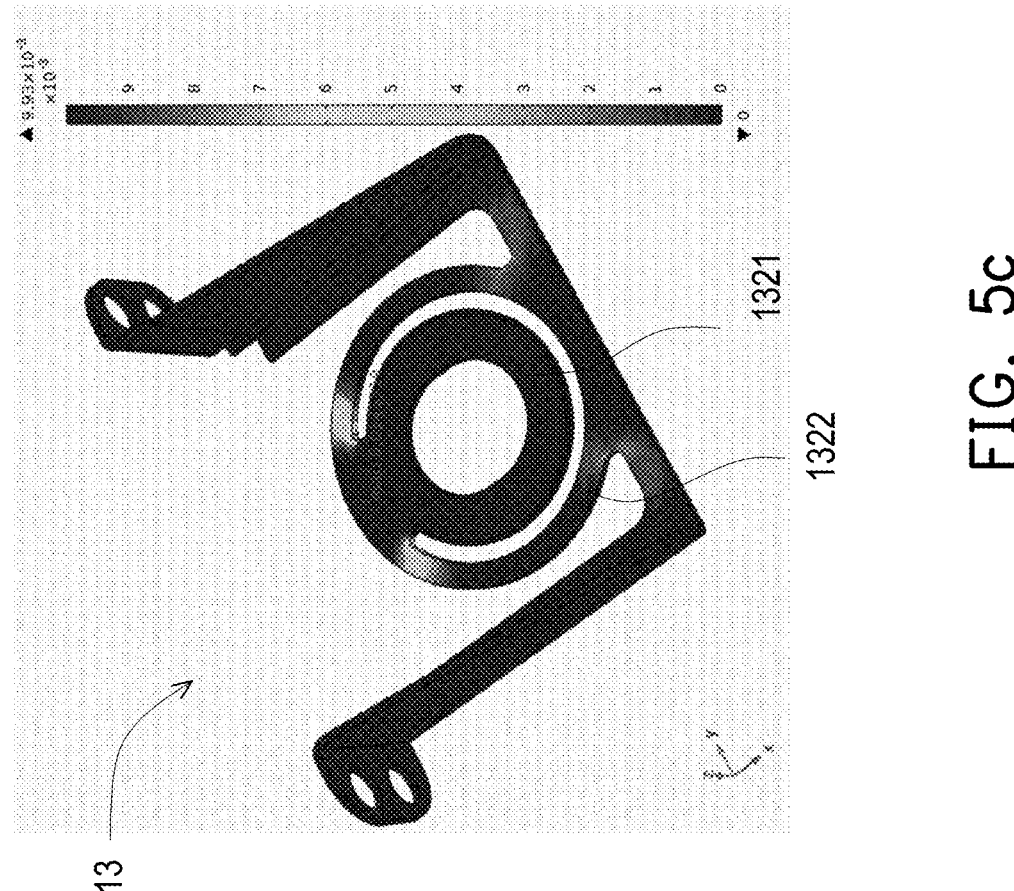
FIG. 5c is a schematic diagram of the stress experienced by the mounting structure.

FIG. 5a is a schematic diagram illustrating that the second substrate of the power module is subjected to uniform stress. FIG. 5b is a schematic diagram of the stress experienced by the housing. FIG. 5c is a schematic diagram of the stress experienced by the mounting structure.

As shown in FIGS. 5a and 5b, the housing 12 has uniform stress, and the second substrate 112 of the power module 11 is also subjected to uniform stress. Therefore, the bottom surface (not shown) of the second substrate 112 of the power module 11 can be in contact with the first substrate 2 located under the power module 11 with a large area as much as possible. When the first substrate 2 located under the power module 11 is a heat dissipation substrate, since the second substrate 112 of the power module 11 is in contact with the heat dissipation substrate with the largest contact area, the heat of the power module 11 can be effectively dissipated, and the power semiconductor 114 may be maintained in good operation, thereby prolonging the service life.

As shown in FIGS. 4 and 5c, after the locking member 14 is locked into the first substrate 2, the connection between the inner ring 1321 and the outer ring 1322 is subjected to relatively large stress, while the stress at other places is uniform, which effectively reduces the possible damaged parts of the mounting structure 13 and improves the locking stability and reliability.

Figure 6B:
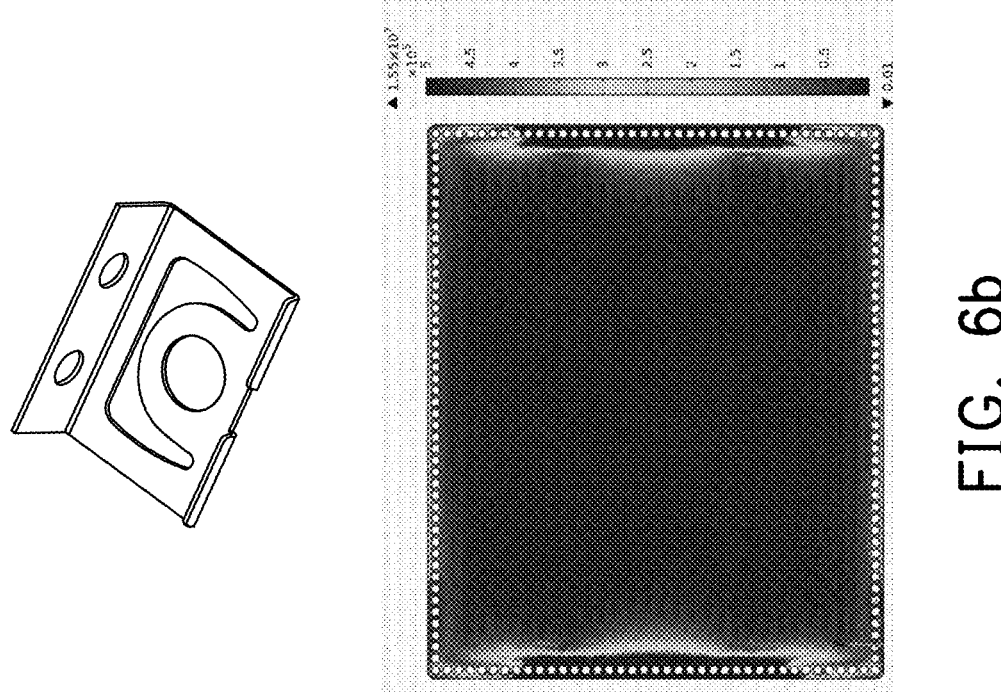
FIGS. 6a and 6b are comparison diagrams of the stress distribution of the second substrate when the mounting structure of FIG. 1 and a conventional mounting structure are locked.
Figure 6B:
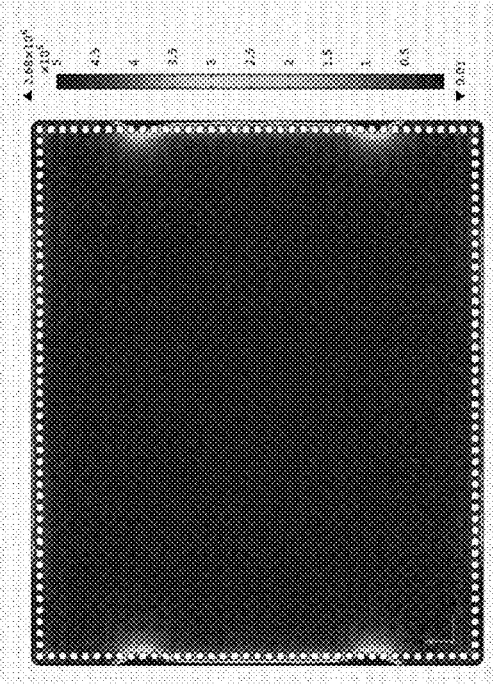
Figure 6A:
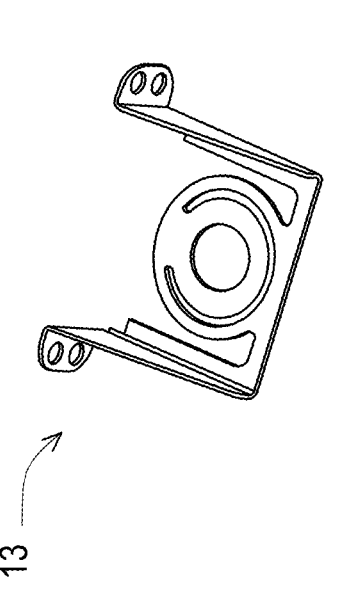

FIGS. 6a and 6b are comparison diagrams of the stress distribution of the second substrate when the mounting structure of FIG. 1 and a conventional mounting structure are locked. FIG. 6a shows the mounting structure 13 of the disclosure that has been improved, which may effectively reduce the maximum stress to 2.68 MPa, and the stress distribution is uniform. FIG. 6b shows the conventional mounting structure, the relatively large stress to which the conventional mounting structure under the locking needs to be subjected is 15.5 MPa, and the stress distribution is relatively non-uniform.

In addition, the shapes of the inner ring 1321 and the outer ring 1322 of the aforementioned locking ring 132 are not limited to the circular shapes shown in FIG. 3a, and may be changed as required. FIGS. 7a to 7d are schematic views of other possible embodiments of the locking ring.

Figure 7B:
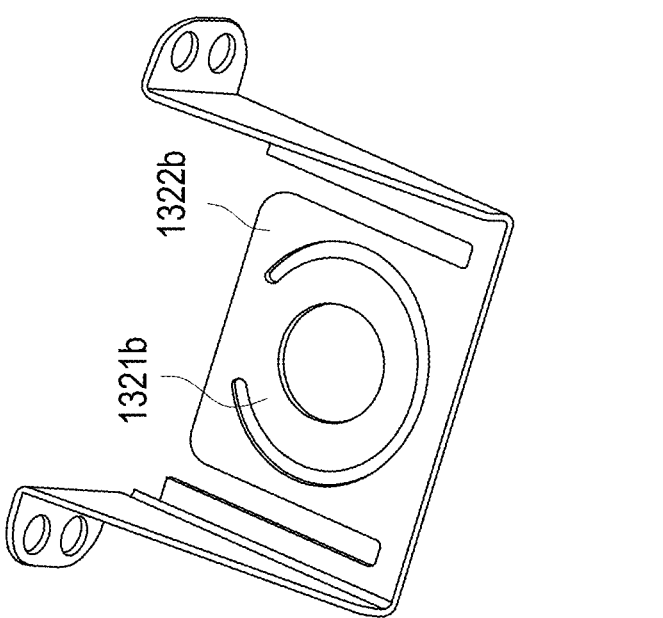
FIGS. 7a to 7d are schematic views of other possible embodiments of the locking ring.
Figure 7A:
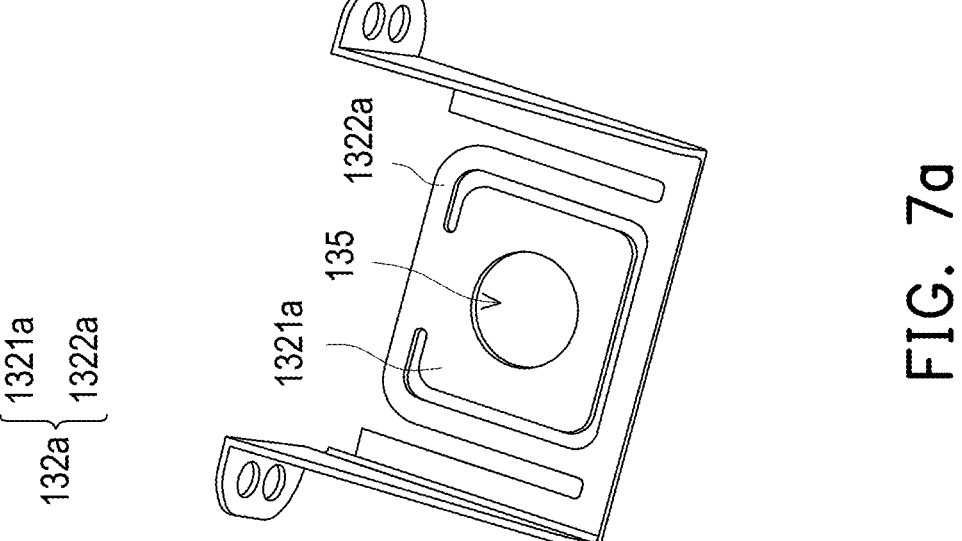

As shown in FIG. 7a, the outer contours of an inner ring 1321a and an outer ring 1322a of a locking ring 132a are rectangular shapes, and a locking hole 135 of the inner ring 1321a is a capsule or circular shape. The locking hole 135 that is a capsule shape may increase the alignment tolerance of the mounting structure 132 and the first substrate 2. Such a shape configuration of the locking ring 132 increases the contact area between the locking member 14 (shown in FIG. 1) and the inner ring 1321a and the contact area between the inner ring 1321a and the first substrate 2 (shown in FIG. 1), and improves the locking stability.

As shown in FIG. 7b, the outer contour of an outer ring 1322b is a rectangular shape and the outer contour of an inner ring 1321b is a circular shape. Such a shape configuration increases the structural rigidity of the outer ring 1322b.

Certainly, the shapes of the inner ring 1321 and the outer ring 1322 are not limited to the shapes exemplified in the specification, and the inner ring 1321 and the outer ring 1322 may be in any shape without departing from the spirit of the disclosure.

Figure 7D:
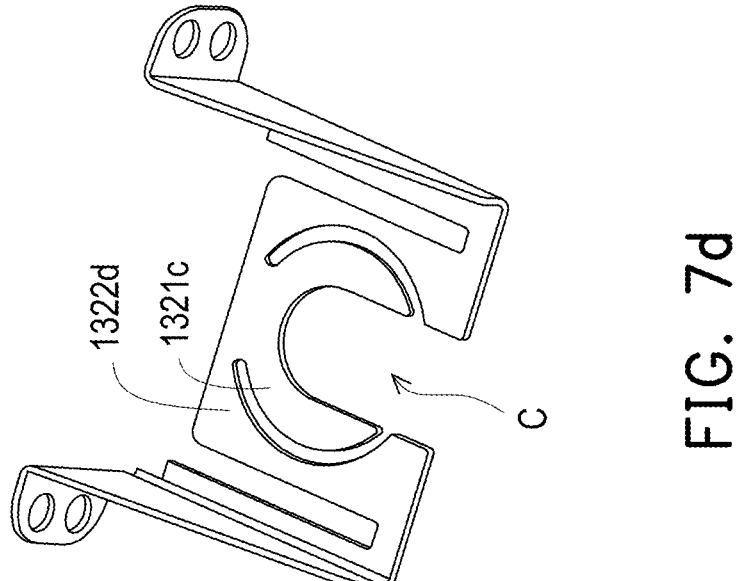
Figure 7C:
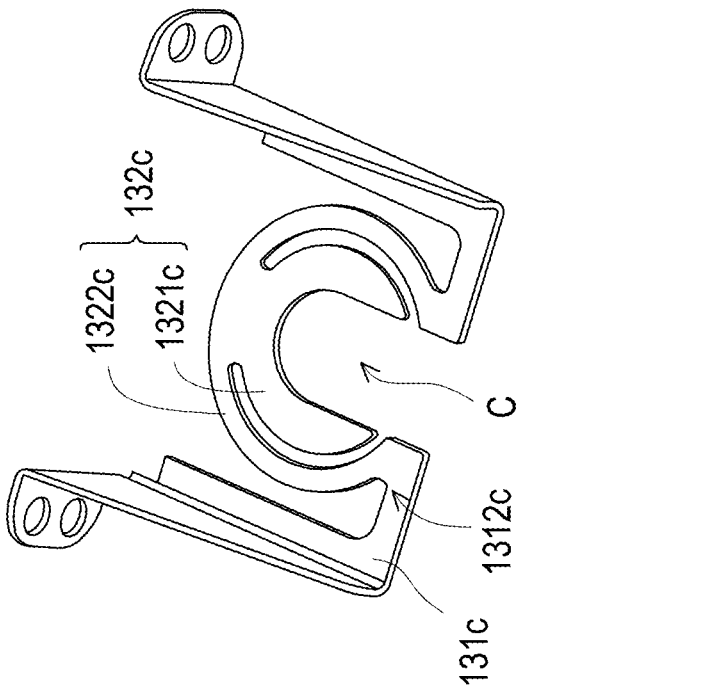

As shown in FIG. 7c, a locking ring 132c may further have a slit opening C, and the slit opening C penetrates an outer ring 1322c and an inner ring 1321c from a side 1312c where the locking ring 132c is connected to a main body 131c. Such a configuration facilitates a user to be able to disassemble the housing 12 (shown in FIG. 1) from the first substrate 2 (shown in FIG. 1) by means of translation under the situation where the user unscrews the locking member 14 (shown in FIG. 1) from the first substrate 2 (shown in FIG. 1) and the locking member 14 (shown in FIG. 1) is not completely separated from the first substrate 2 (shown in FIG. 1). For the user, when one of the locking members 14 on both sides may be unscrewed and separated from the first substrate 2, the one on the other side merely needs to be loosened without being completely separated from the first substrate 2 to take out the entire module device 1 by translation, which can achieve the effect of quick disassembly and installation.

As shown in FIG. 7d, the only difference from FIG. 7c is that the outer contour of an outer ring 1322d is a rectangular shape.

Figure 8A:
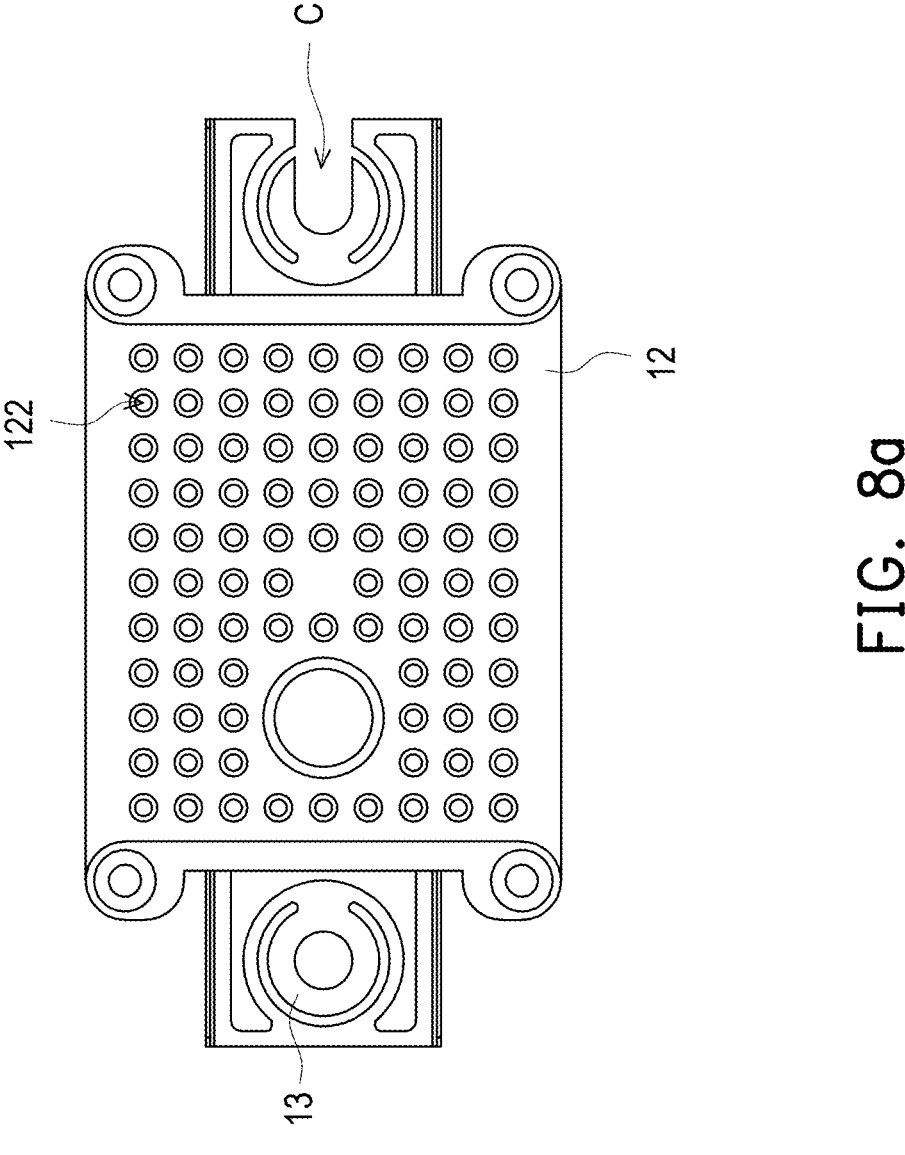
FIGS. 8a and 8b are schematic diagrams of module devices in different embodiments.
Figure 8B:
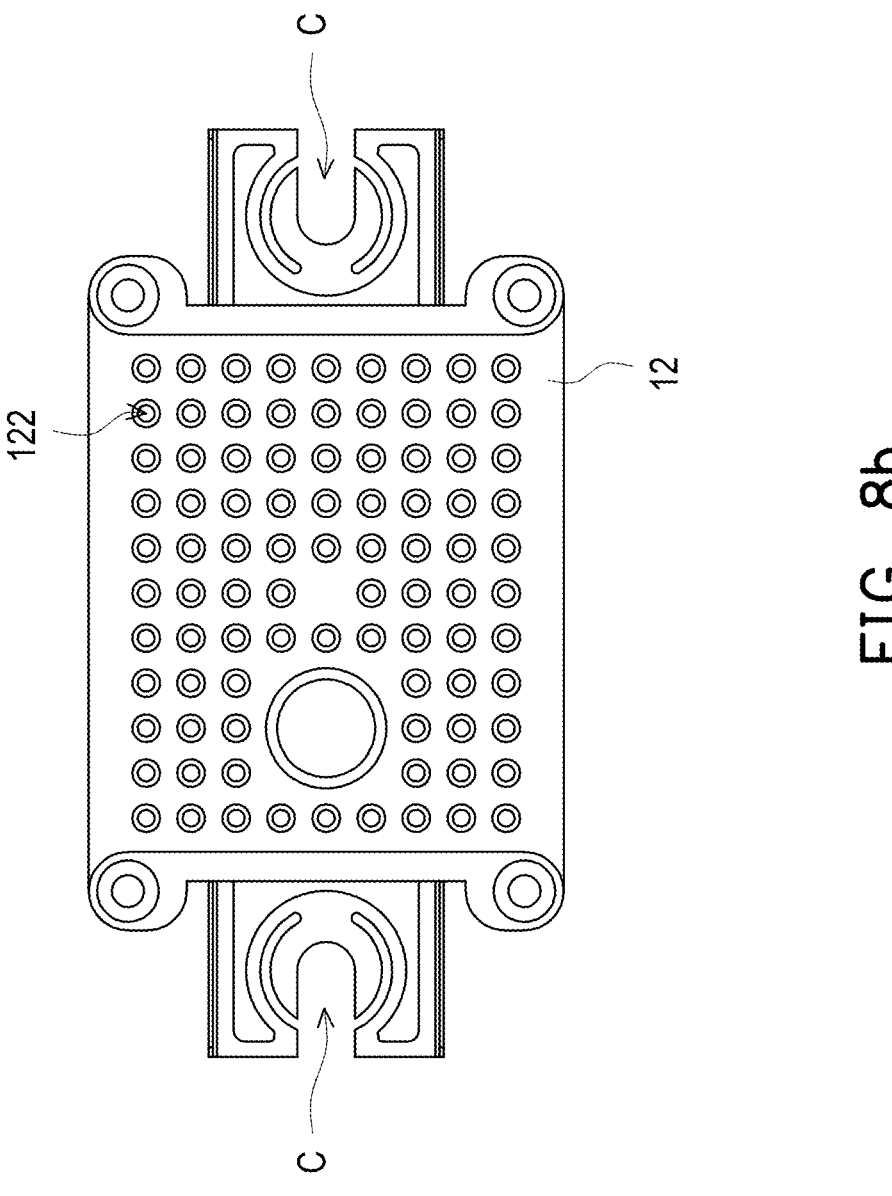

FIGS. 8a and 8b are schematic diagrams of module devices in different embodiments. Referring to FIG. 8a, the mounting structures disposed on opposite sides of the housing 12 may be asymmetrically disposed. Specifically, the mounting structure 13 shown in FIG. 3a may be disposed on one side of the housing 12, and the mounting structure shown in FIG. 7d may be disposed on the other side of the housing 12.

Alternatively, as shown in FIG. 8b, the mounting structure shown in FIG. 7d is disposed on opposite sides of the housing 12.

To sum up, in the module device of the disclosure, at least the following effects are achieved by improving the mounting structure:

1. The mating stability of the mounting structure and the housing are improved.
2. The contact area between the module device and the substrate is increased, and the internal stress when the module device is locked on the substrate is reduced. In addition, when the substrate is a heat dissipation substrate, the heat dissipation effect is further improved.
3. The permanent damage and deformation area of the locking ring is reduced, and the reliability and stability of the locking are improved.

What is claimed is:

1. A module device, adapted to be installed on a first substrate, the module device comprising:
   a power module;
   a housing, covering the power module;
   a pair of mounting structures, installed on a pair of opposite sides of the housing, each of the pair of mounting structures comprises:
      a main body, having a first portion and two second portions extending from two ends of the first portion perpendicularly;
      a locking ring, disposed within a space formed by the first portion and the two second portions, wherein the locking ring is a double-ring structure, which comprises an inner ring and an outer ring surrounding outside of the inner ring, a first side of the outer ring is extended from the first portion of the main body, the second portions are spaced from the outer ring, the inner ring is connected to a second side of the outer ring and not connected to the first side of the outer ring whereas the first side and the second side are opposite sides;
      a pair of ribs, disposed on the two second portions correspondingly, extending from a top surface of the main body along a normal direction of the top surface;
      a pair of anchoring portions, disposed at ends of the pair of ribs, and extending directions of the pair of anchoring portions are parallel to an extending direction of the first portion; and
   a pair of locking members, passing through the corresponding pair of locking rings and being locked into the first substrate.

2. The module device according to claim 1, wherein outer contours of the inner ring and the outer ring are circular shapes.

3. The module device according to claim 1, wherein outer contours of the inner ring and the outer ring are rectangular shapes.

4. The module device according to claim 1, wherein an outer contour of the outer ring is a rectangular shape and an outer contour of the inner ring is a circular shape.

5. The module device according to claim 1, wherein the locking ring further has a slit opening, and the slit opening penetrates the outer ring and the inner ring from the first side where the locking ring is connected to the main body.

6. The module device according to claim 1, wherein the pair of ribs extend from the first side where the locking ring is connected to the main body toward the pair of anchoring portions in a triangular or trapezoidal shape.

7. The module device according to claim 6, wherein each of the pair of ribs has a first side and a second side, the first side is adjacent to the anchoring portion, the second side is adjacent to the side where the locking ring is connected to the main body, and a length of the first side is greater than a length of the second side.

8. The module device according to claim 1, wherein the pair of anchoring portions are embedded in a sidewall of the housing.

9. The module device according to claim 1, wherein the power module has a second substrate, at least one power semiconductor, and a plurality of pins, the at least one power semiconductor and the pins are disposed on the second substrate, and the housing has a plurality of sockets for insertion of the pins.

10. The module device according to claim 1, wherein before the pair of locking members are locked into the first substrate, a gap exists between a bottom surface of the mounting structure and a bottom surface of the housing.

11. The module device according to claim 1, wherein after the pair of locking members are locked into the first substrate, a bottom surface of the mounting structure is in contact with the first substrate.

12. The module device according to claim 1, wherein each of the inner rings has a locking hole, and the pair of locking members are locked into the corresponding locking holes.

13. The module device according to claim 12, wherein the locking hole is a capsule or circular shape.

14. A module device, adapted to be installed on a first substrate, the module device comprising:

a power module;

a housing, covering the power module;

a pair of mounting structures, installed on a pair of opposite sides of the housing, each of the pair of mounting structures comprises:

a main body, having a first portion and two second portions extending from two ends of the first portion perpendicularly;

a locking ring, disposed within a space formed by the first portion and the two second portions, wherein the locking ring is a double-ring structure, which comprises an inner ring and an outer ring surrounding outside of the inner ring, and the second portions are spaced from the outer ring, wherein the locking ring has a slit opening, and the slit opening penetrates the outer ring and the inner ring from a side where the locking ring is connected to the main body, the inner ring is disconnected at the side where the locking ring is connected to the main body while the outer ring is also disconnected at the side where the locking ring is connected to the main body;

a pair of ribs, disposed on the two second portions correspondingly, extending from a top surface of the main body along a normal direction of the top surface; and a pair of anchoring portions, disposed at ends of the pair of ribs, and extending directions of the pair of anchoring portions are parallel to an extending direction of the first portion; and a pair of locking members, passing through the corresponding pair of locking rings and being locked into the first substrate.

15. The module device according to claim 14, wherein the other of the pair of mounting structures comprises:

a main body;

a locking ring, extending from a side of the main body toward an inner side of the main body, wherein the locking ring is a double-ring structure, which comprises an inner ring and an outer ring, a first side of the outer ring is connected to the main body, a second side of the outer ring is connected to the inner ring, and the first side and the second side are opposite sides;

a pair of ribs, extending from a top surface of the main body along a normal direction of the top surface; and a pair of anchoring portions, disposed at ends of the pair of ribs, and extending directions of the pair of anchoring portions are perpendicular to extending directions of the pair of ribs.

16. A mounting structure, adapted to be on one of a pair of opposite sides of a housing of a module device, comprising:

a main body, having a first portion and two second portions extending from two ends of the first portion perpendicularly;

a locking ring, disposed within a space formed by the first portion and the two second portions, wherein the locking ring is a double-ring structure, which comprises an inner ring and an outer ring surrounding outside of the inner ring, a first side of the outer ring is extended from the first portion of the main body, the second portions are spaced from the outer ring, the inner ring is connected to a second side of the outer ring and not connected to the first side of the outer ring whereas the first side and the second side are opposite sides;

a pair of ribs, disposed on the two second portions correspondingly, extending from a top surface of the main body along a normal direction of the top surface; and a pair of anchoring portions, disposed at ends of the pair of ribs, and extending directions of the pair of anchoring portions are parallel to an extending direction of the first portion, wherein a connection between the inner ring and the outer ring is subjected to a larger stress than a connection between the outer ring and the first portion when a pair of locking members passing through the corresponding pair of locking rings and being locked into a first substrate of the module device.

\* \* \* \* \*